(12) United States Patent
Andreev et al.

(10) Patent No.: US 6,587,990 B1
(45) Date of Patent: Jul. 1, 2003

(54) METHOD AND APPARATUS FOR FORMULA AREA AND DELAY MINIMIZATION

(75) Inventors: Alexander Andreev, San Jose, CA (US); Ranko Scepanovic, San Jose, CA (US); Anatoli Bolotov, Moscow (RU)

(73) Assignee: LSI Logic Corporation, Milpitas, CA (US)

( * ) Notice: Subject to any disclaimer, the term of this patent is extended or adjusted under 35 U.S.C. 154(b) by 121 days.

(21) Appl. No.: 09/678,201

(22) Filed: Oct. 1, 2000

(51) Int. Cl.[7] ................................................ G06F 17/50
(52) U.S. Cl. ............................................................ 716/2
(58) Field of Search ................... 716/2–7, 18; 714/724, 714/726; 703/1

(56) References Cited

U.S. PATENT DOCUMENTS 6,212,669 B1 * 4/2001 Jain .............................. 716/7

* cited by examiner

*Primary Examiner*—Vuthe Siek
*Assistant Examiner*—Naum Levin
(74) *Attorney, Agent, or Firm*—Mitchell Silberberg & Knupp LLP

(57) ABSTRACT

The present invention is a method and apparatus for optimizing the design of a combinational circuit. The method includes constructing a circuit sheaf for the combinational circuit and then performing vector optimization with domination. In the preferred embodiment, a complete BDD B is determined and, from that, a list of F-sets is computed. If the combinational circuit includes cells other than NOT, AND and XOR cells, the circuit is first transformed such that it only has those types of cells.

12 Claims, 14 Drawing Sheets

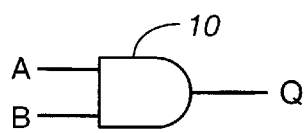
FIG._1A
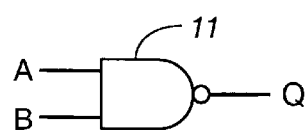
FIG._1B
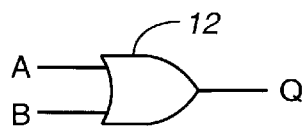
FIG._1C
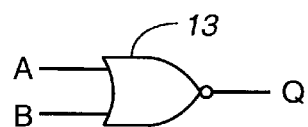
FIG._1D
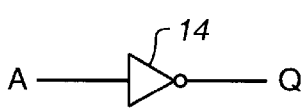
FIG._1E
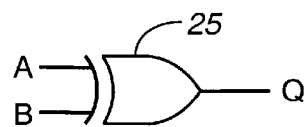
FIG._3A
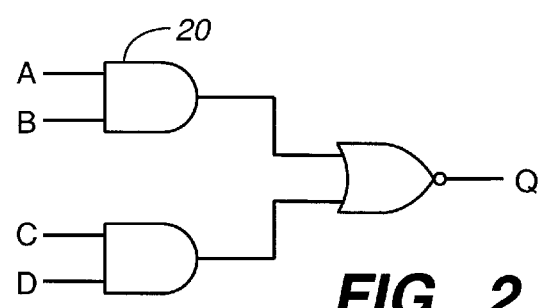
FIG._2
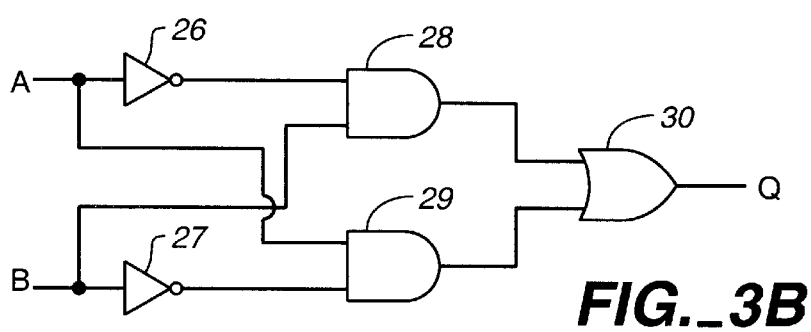
FIG._3B

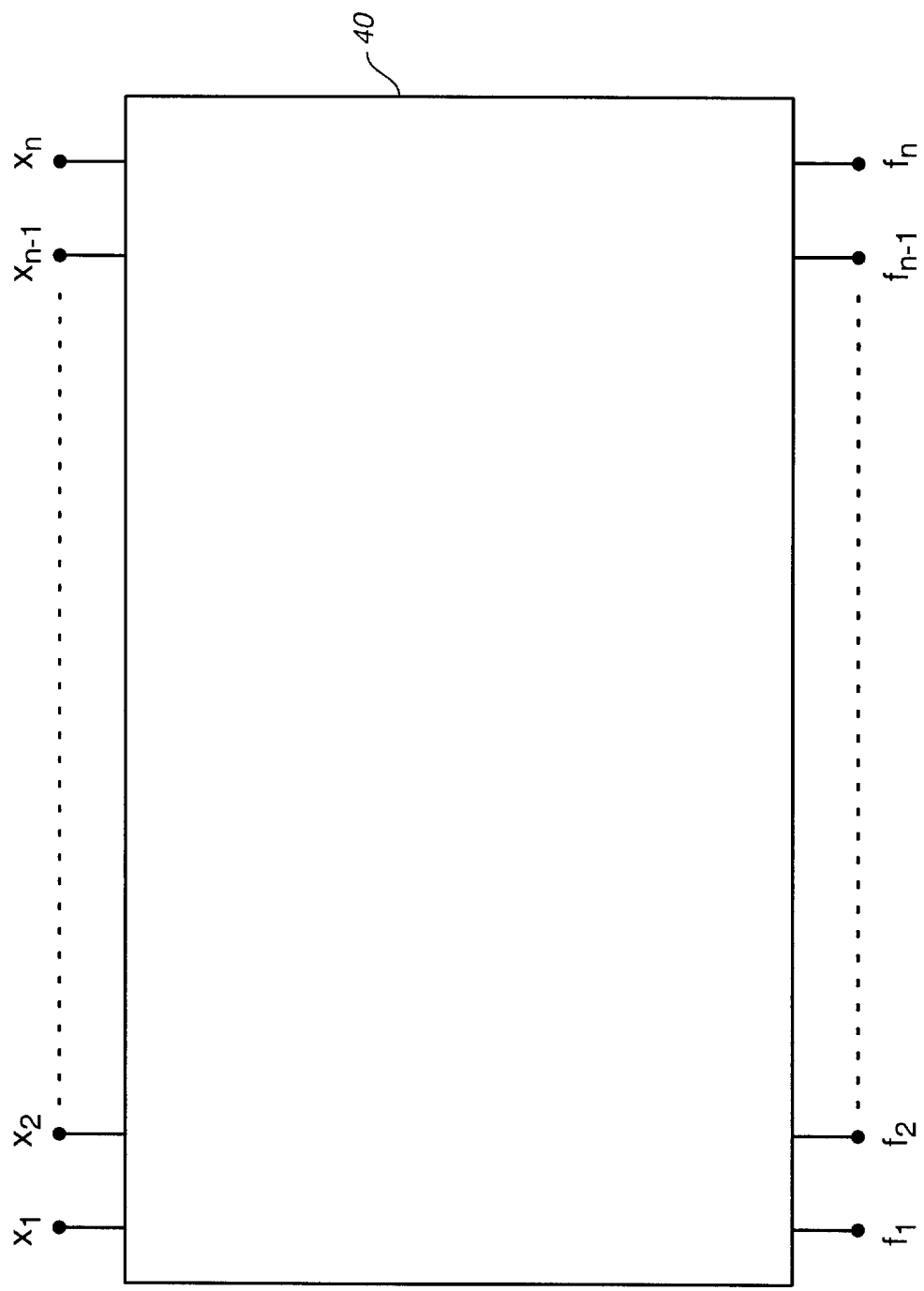
FIG._4

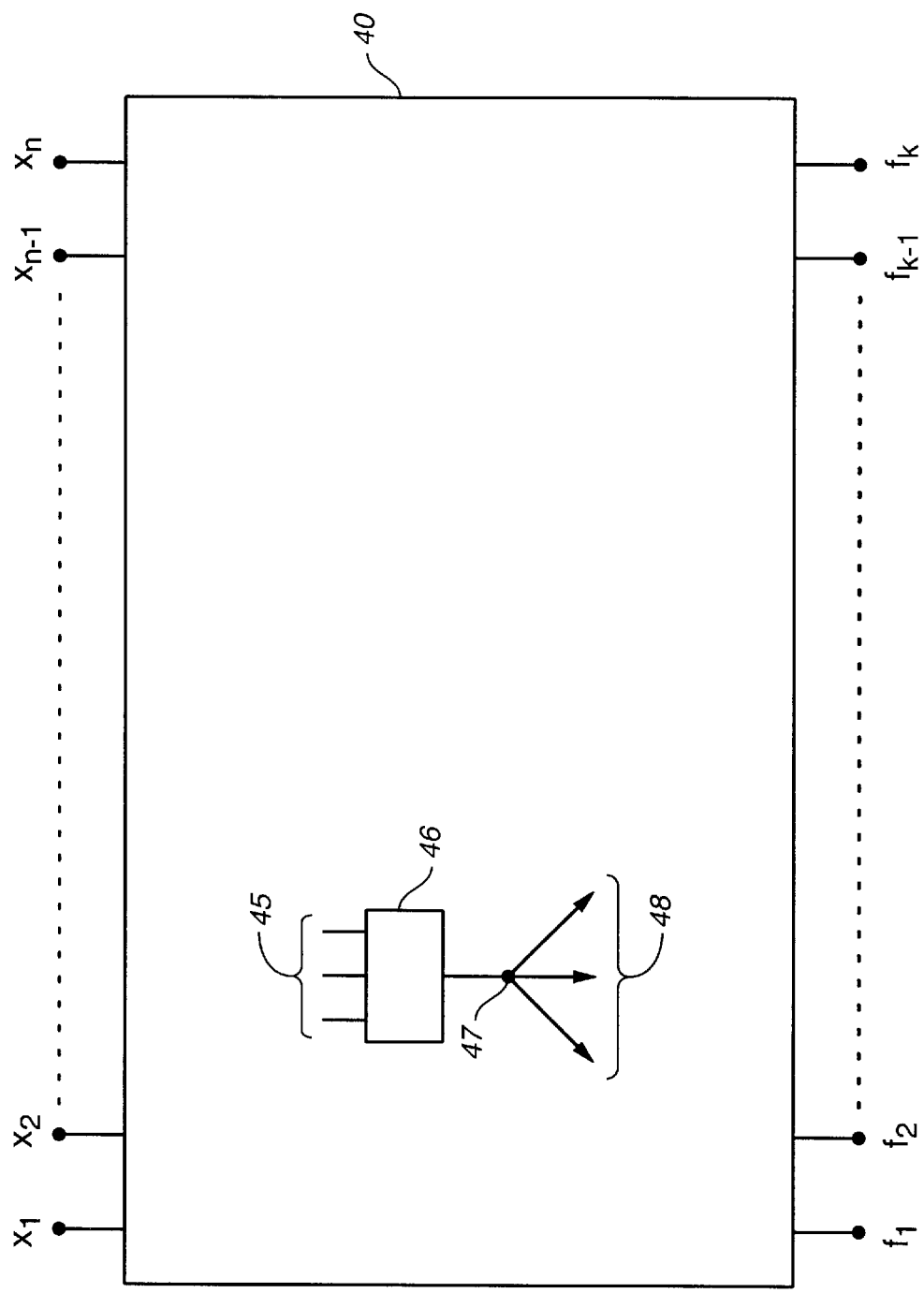
FIG._5

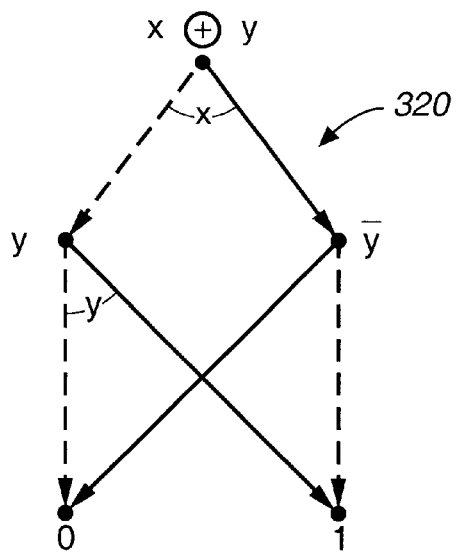
FIG._6A
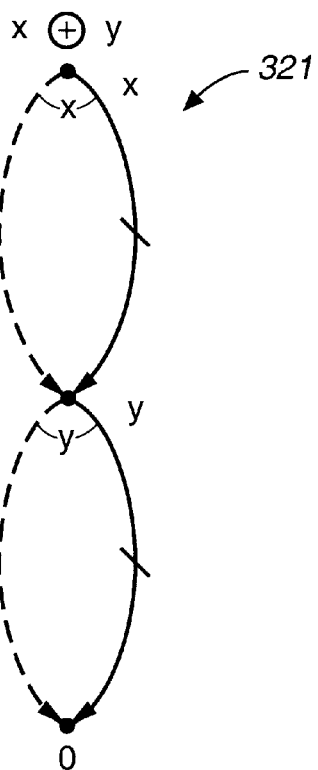
FIG._6B

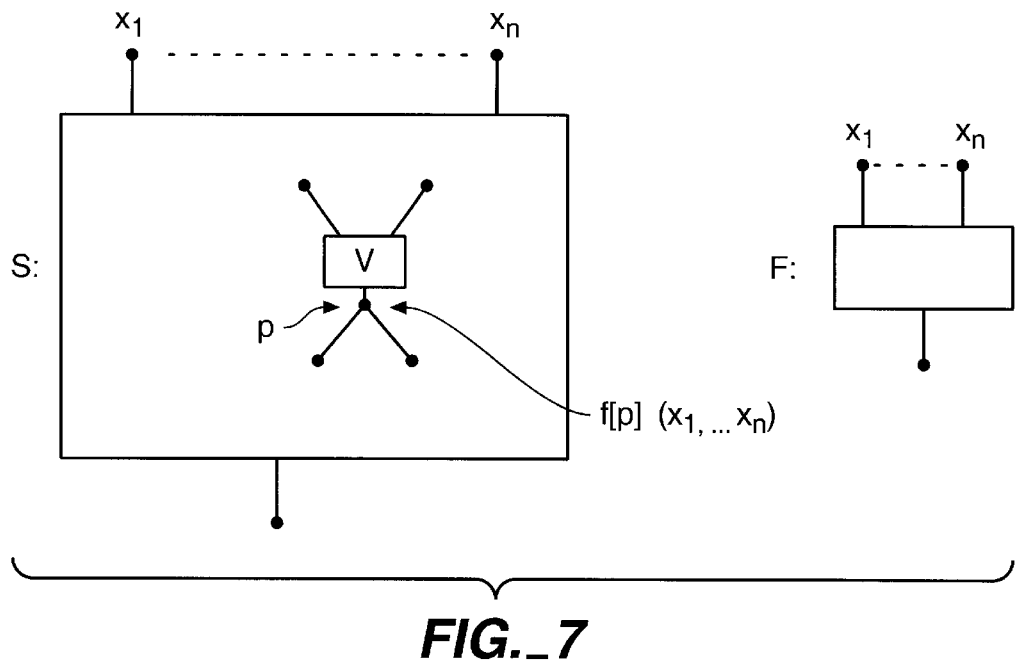
FIG._7
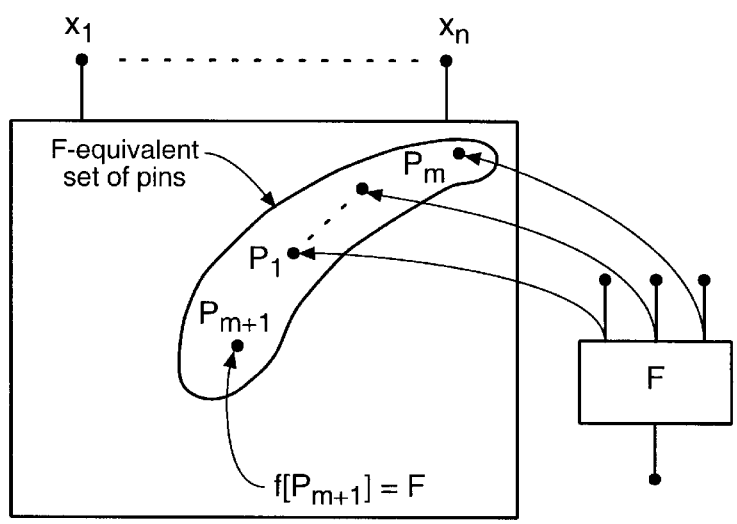
FIG._8

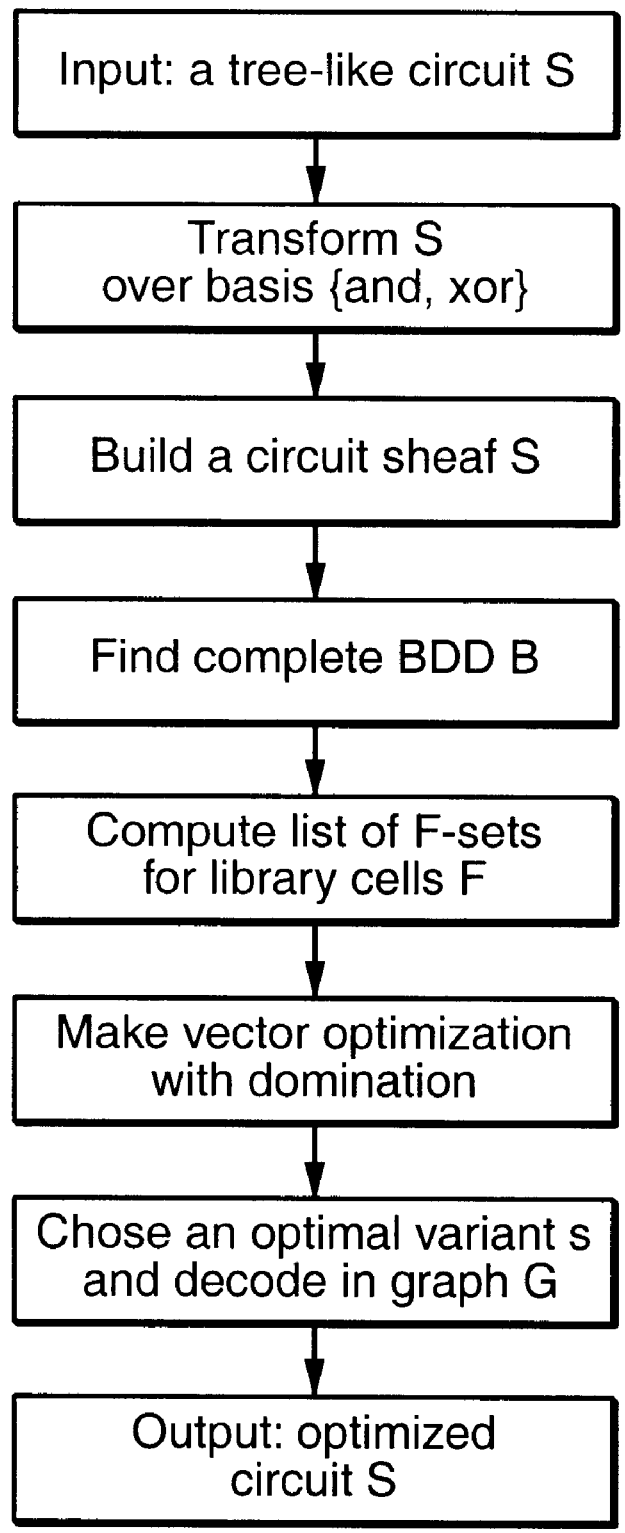
FIG._9

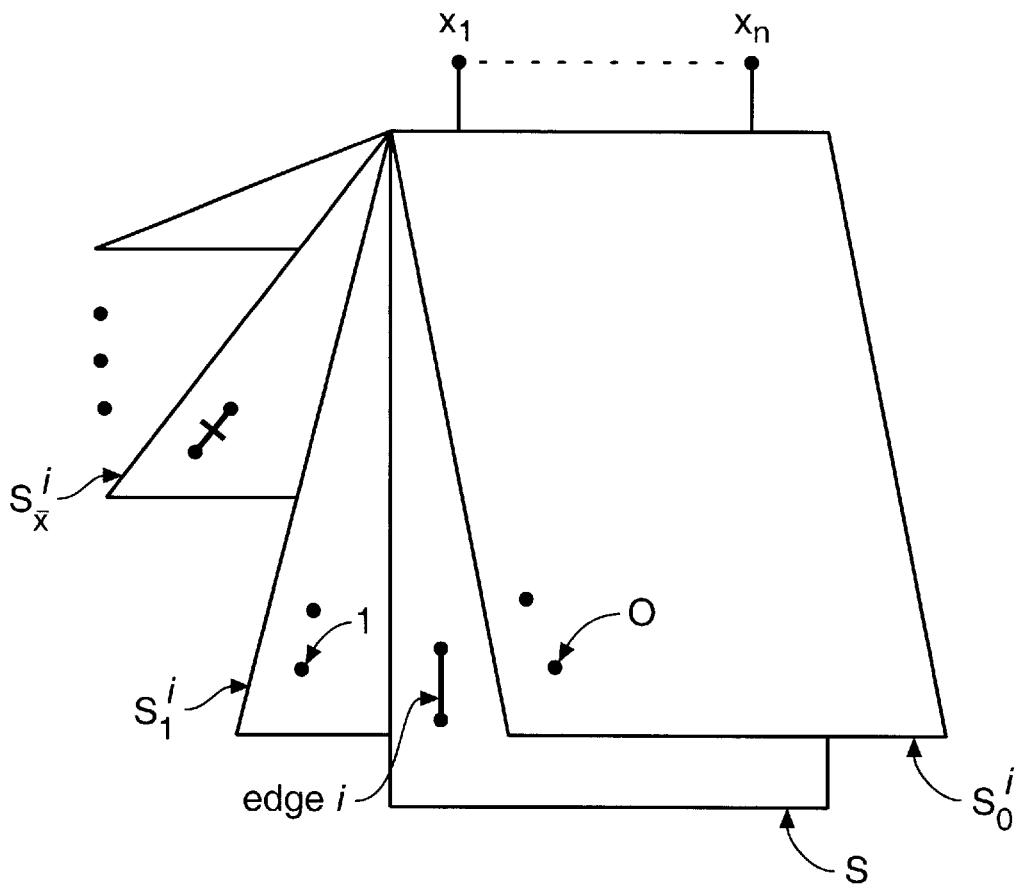
FIG._10
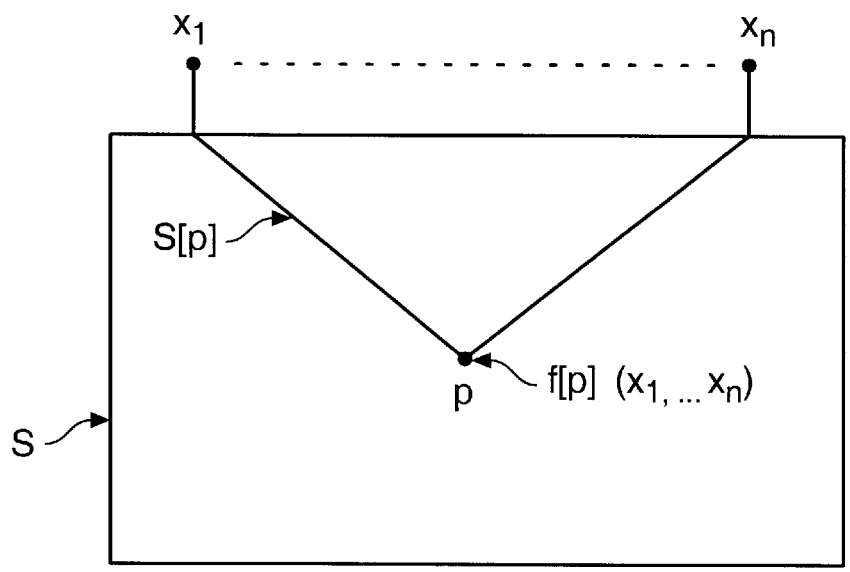
FIG._11

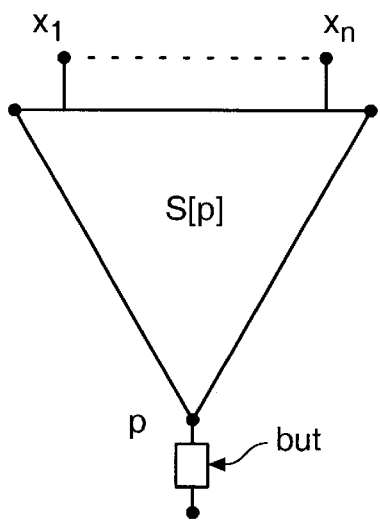
FIG._12A
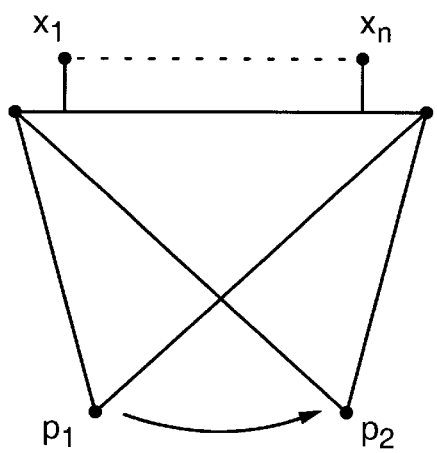
FIG._12B
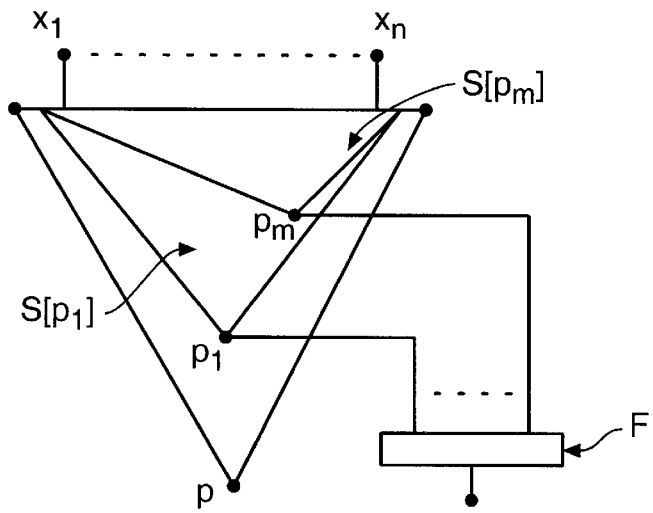
FIG._12C
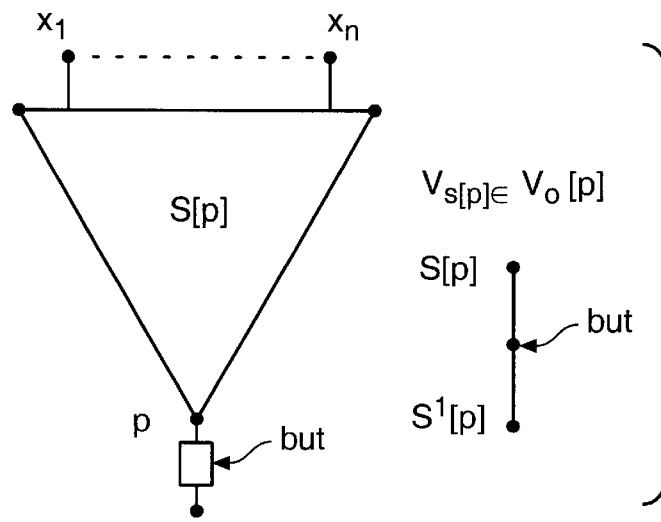
FIG._13

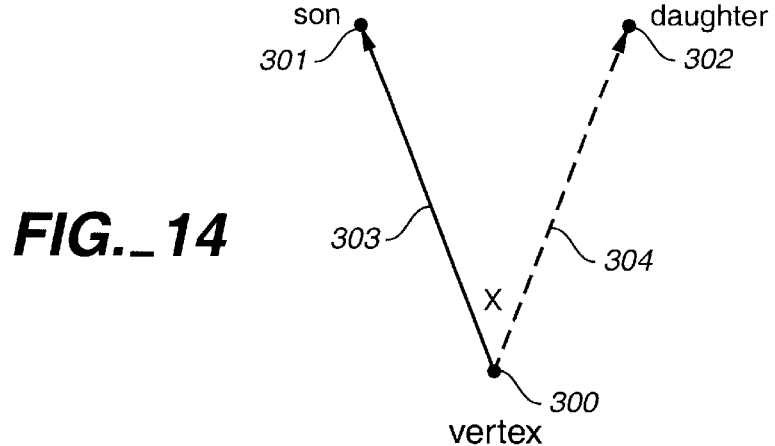
FIG._14
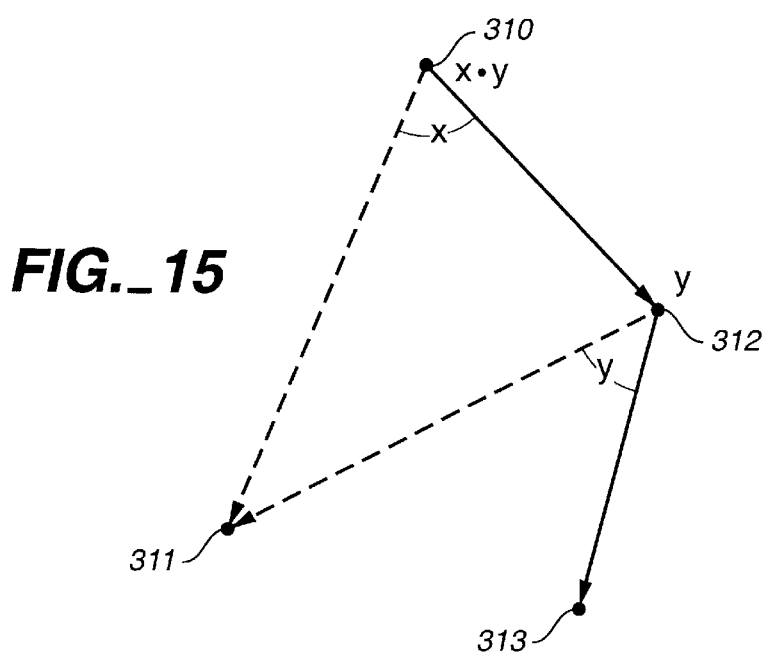
FIG._15
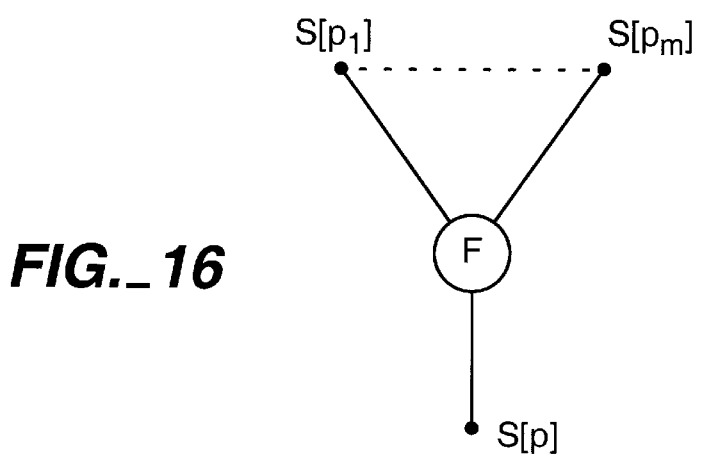
FIG._16

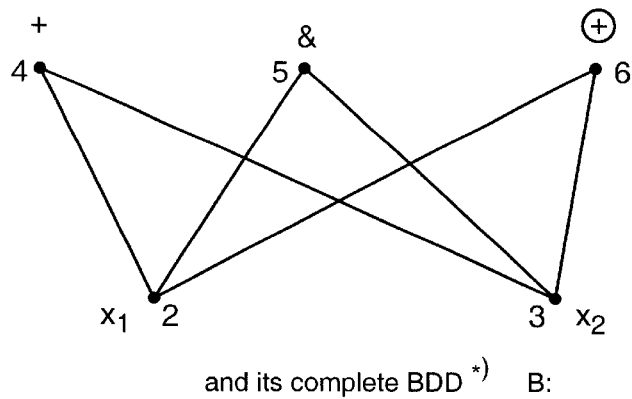
and its complete BDD *) B:
FIG._17
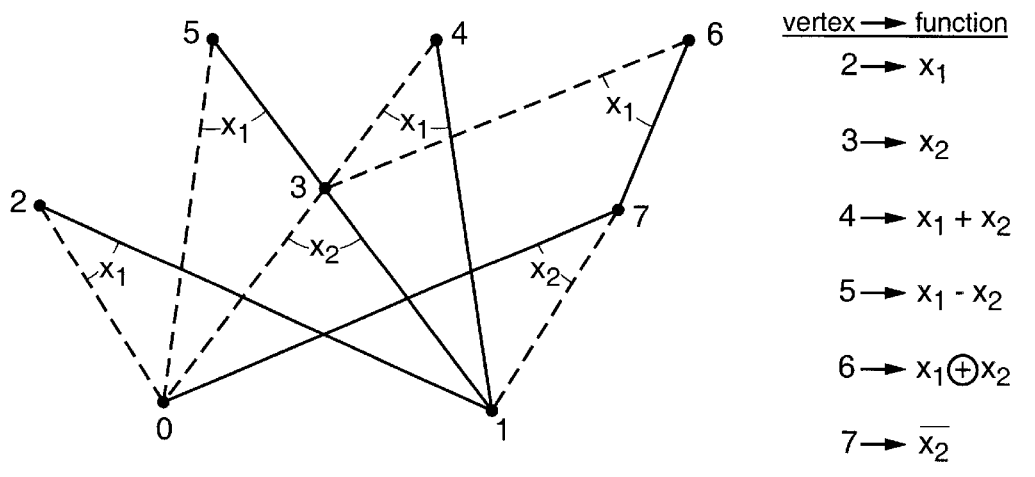
| vertex | function |
|---|---|
| 2 → | $x_1$ |
| 3 → | $x_2$ |
| 4 → | $x_1 + x_2$ |
| 5 → | $x_1 \cdot x_2$ |
| 6 → | $x_1 \oplus x_2$ |
| 7 → | $\overline{x_2}$ |
FIG._18

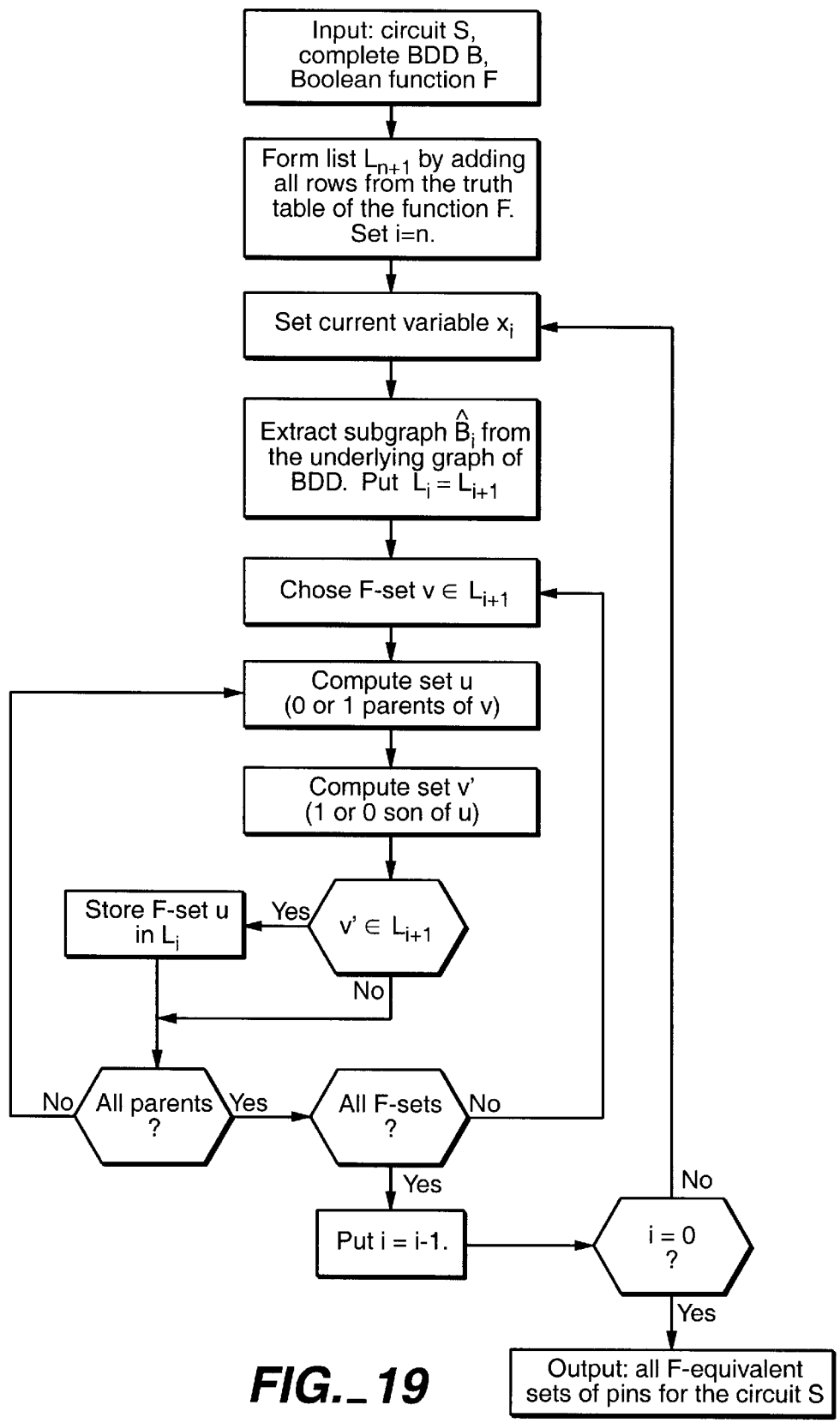
FIG._19

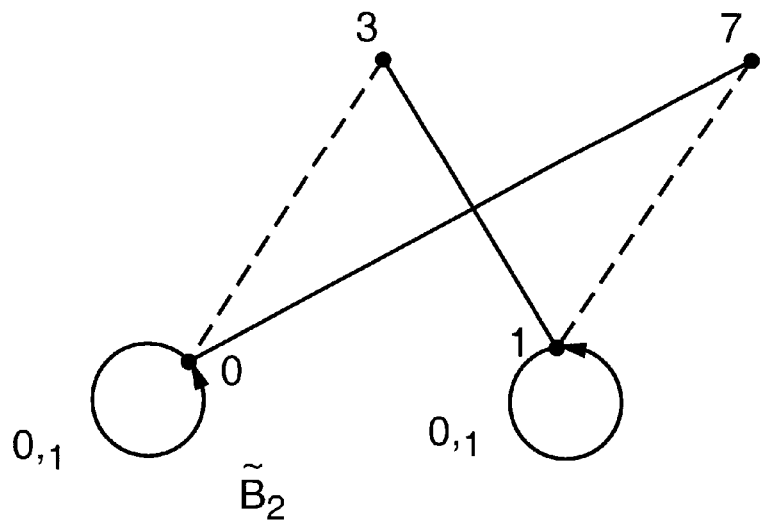
FIG._20A
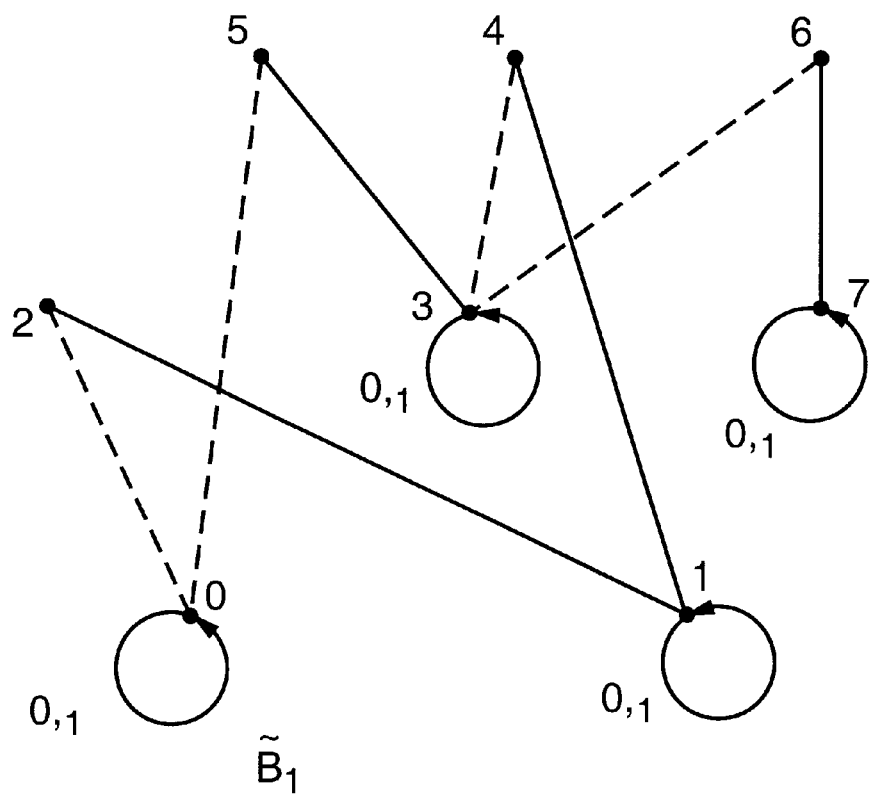
FIG._20B

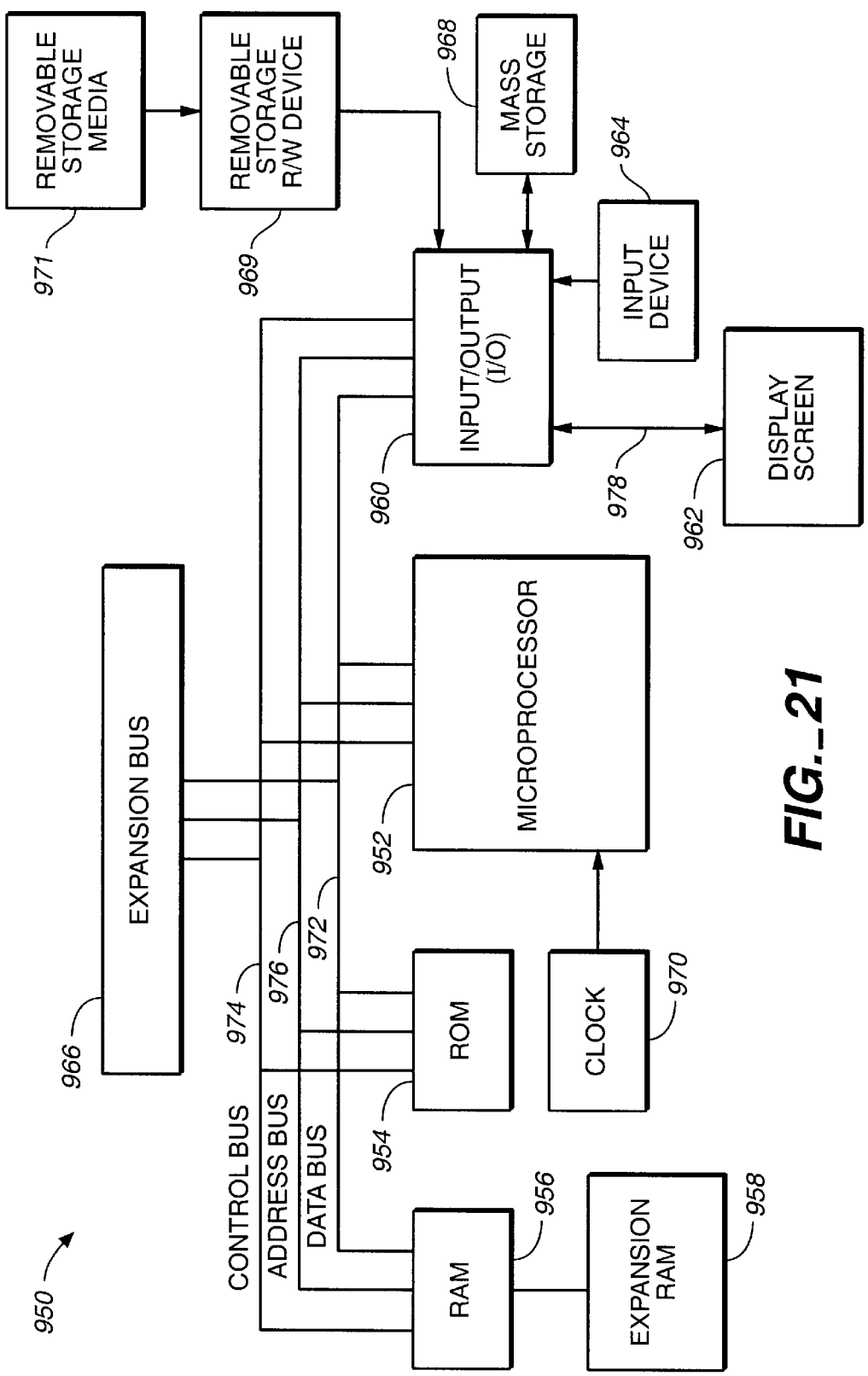
FIG._21

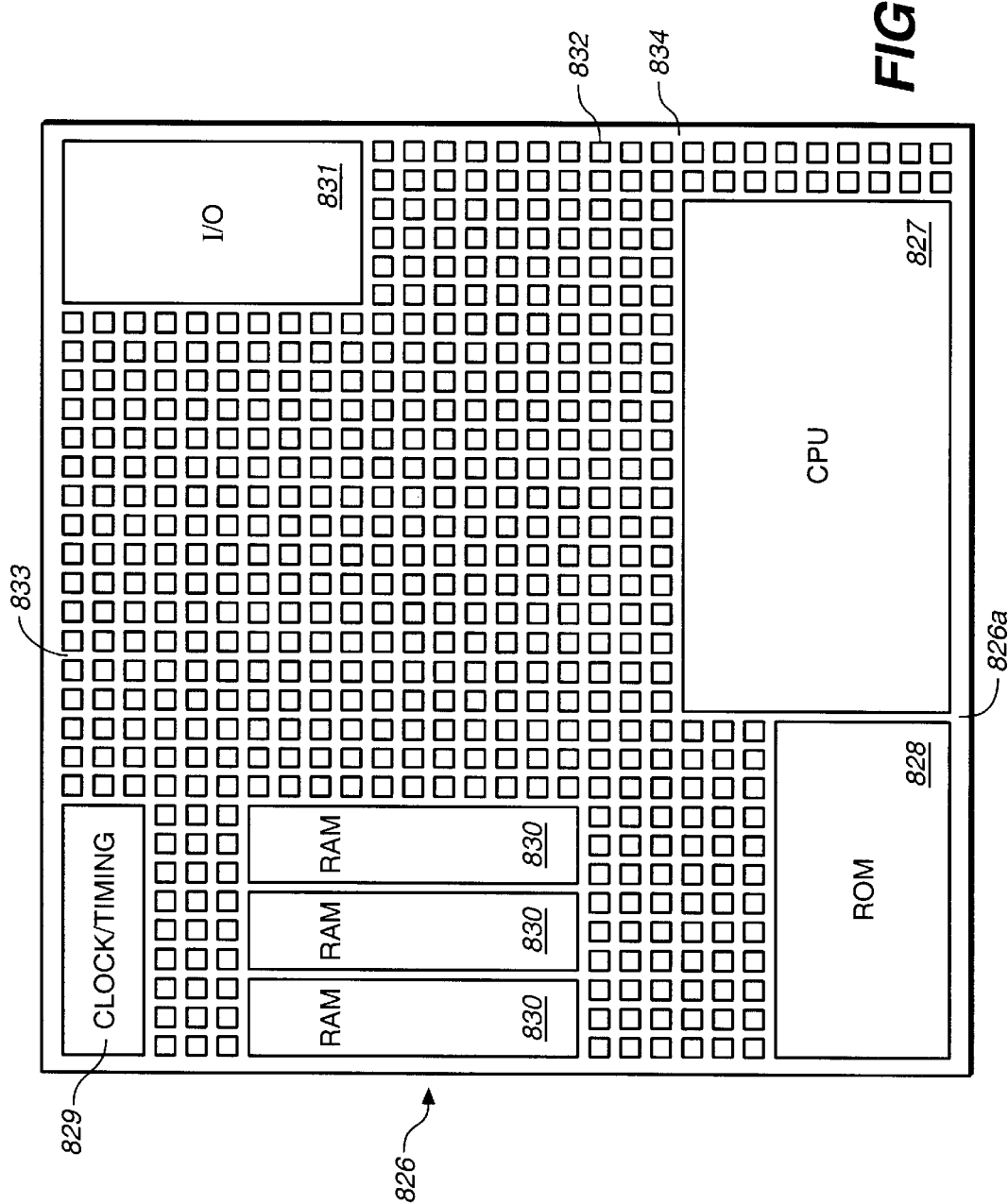
FIG._22

METHOD AND APPARATUS FOR FORMULA AREA AND DELAY MINIMIZATION

BACKGROUND OF THE INVENTION

1. Field of the Invention

This invention relates to methods of analyzing and optimizing design of integrated circuit (IC) designs.

2. Description of the Related Art

An integrated circuit chip (hereafter referred to as an "IC" or a "chip") comprises cells and connections between the cells formed on a surface of a semiconductor substrate. The IC may include a large number of cells and require complex connections between the cells.

A cell is a group of one or more circuit elements such as transistors, capacitors, and other basic circuit elements grouped to perform a function. Each of the cells of an IC may have one or more pins, each of which, in turn, may be connected to one or more other pins of the IC by wires. The wires connecting the pins of the IC are also formed on the surface of the chip.

A net is a set of two or more pins which must be connected, thus connecting the logic circuits having the pins. Because a typical chip has thousands, tens of thousands, or hundreds of thousands of pins, that must be connected in various combinations, the chip also includes definitions of thousands, tens of thousands, or hundreds of thousands of nets, or sets of pins. The number of the nets for a chip is typically in the same order as the order of the number of cells on that chip. Commonly, a majority of the nets include only two pins to be connected; however, many nets comprise three or more pins.

SUMMARY OF THE INVENTION

The present invention is a method and apparatus for optimizing the design of a combinational circuit. The method includes constructing a circuit sheaf for the combinational circuit and then performing vector optimization with domination. In the preferred embodiment, a complete BDD B is determined and, from that, a list of F-sets is computed. If the combinational circuit includes cells other than NOT, AND and XOR cells, the circuit is first transformed such that it only has those types of cells.

BRIEF DESCRIPTION OF THE DRAWINGS

FIG. 1A depicts the schematic symbol for an AND gate;

FIG. 1B depicts the schematic symbol for a NAND gate;

FIG. 1C depicts the schematic symbol for an OR gate;

FIG. 1D depicts the schematic symbol for a NOR gate;

FIG. 1E depicts the schematic symbol for an inverter;

FIG. 2 depicts an AND-OR-INVERT gate;

FIG. 3A depicts the schematic symbol for an XOR gate;

FIG. 3B depicts the mechanization of the XOR gate;

FIG. 4 provides a depiction of a combinational circuit S;

FIG. 5 provides an illustration of a cell within a combinational circuit S;

FIG. 6A illustrates a BDD 320 for the function $x \oplus y$;

FIG. 6B illustrates its variant 321 with negative edges;

FIG. 7 illustrates a combination circuit with a Boolean function therein;

FIG. 8 illustrates an F-equivalent;

FIG. 9 is a flowchart that illustrates the method of the present invention;

FIG. 10 illustrates a circuit sheaf;

FIG. 11 shows an estimation vector;

FIG. 12a shows a buffer connected to an output;

FIG. 12b shows two output pins;

FIG. 12c shows input pins connected to a library cell;

FIG. 13 shows a new estimation vector;

FIG. 14 illustrates a vertex 300 with a son 301 and daughter 302;

FIG. 15 illustrates a BDD that realizes the function $x \cdot y$;

FIG. 16 shows a graph G;

FIG. 17 shows a combinational circuit S;

FIG. 18 shows a complete BDD B for combinational circuit S;

FIG. 19 is a flow chart showing steps in the present invention;

FIG. 20a depicts a subgraph;

FIG. 20b depicts a second subgraph;

FIG. 21 is an illustration of a general purpose computer system; and

FIG. 22 depicts an exemplary integrated circuit chip.

DESCRIPTION OF THE PREFERRED EMBODIMENTS

A. Logic Gates and Applicable Boolean Algebra

The binary 0 and 1 states are naturally related to true and false logic variables. Accordingly, Boolean algebra is very useful in the design of electronic logic circuits. A useful way of displaying the results of a Boolean operation is with a truth table.

Electronic circuits that combine digital signals according to Boolean algebra are referred to as "logic gates." Commonly used logic circuits are grouped into families. Such families include, for example, resistor-transistor logic (RTL), diode-transistor logic. (DTL), transistor-transistor logic (TTL), N-channel metal-oxide silicon (NMOS), complementary metal-oxide silicon (CMOS) and emitter-coupled logic (ECL). Each family has is advantages and disadvantages. ECL is very fast, for example. MOS features very low power consumption and is therefore often used in VLSI technology.

The schematic symbols of basic logic gates and their associated truth tables are shown in FIGS 1A to 1E. FIG. 1A depicts the schematic symbol for an AND gate 10. The AND gate 10 has inputs A and B and an output Q. The boolean notation is such that Q=A•B. An AND gate operates in accordance with the following truth table (Table 1A). Note that A•0=0;A•1=A;A•A=A; and A•A=0.

TABLE 1A

| A | B | Q |
|---|---|---|
| 0 | 0 | 0 |
| 0 | 1 | 0 |
| 1 | 0 | 0 |
| 1 | 1 | 1 |

FIG. 1B depicts the schematic symbol for a NAND gate 11. The NAND gate 11 has two inputs A and B and an output Q. In accordance with standard Boolean notation, Q=$\overline{A \cdot B}$. A NAND gate operates in accordance with the following truth table (Table 1B).

TABLE 1B

| A | B | Q |
|---|---|---|
| 0 | 0 | 1 |
| 0 | 1 | 1 |
| 1 | 0 | 1 |
| 1 | 1 | 0 |

FIG. 1C depicts the schematic symbol for an OR gate 12. The OR gate 13 has inputs A and B and an output Q. An OR gate operates in accordance with the following truth table (Table 1C). In standard Boolean notation, Q=A+B. Note that A+0=A; A+1=1; A+A=A; and A+$\overline{A}$=1.

TABLE 1C

| A | B | Q |
|---|---|---|
| 0 | 0 | 0 |
| 0 | 1 | 1 |
| 1 | 0 | 1 |
| 1 | 1 | 1 |

FIG. 1D depicts the schematic symbol for a NOR gate 13. The NOR gate 13 has inputs A and B, and an output Q. In standard Boolean notation, Q=$\overline{A+B}$. A NOR gate operates in accordance with the following truth table (Table 1D).

TABLE 1D

| A | B | Q |
|---|---|---|
| 0 | 0 | 1 |
| 0 | 1 | 0 |
| 1 | 0 | 0 |
| 1 | 1 | 0 |

FIG. 1E depicts the schematic symbol for an inverter 14. The NOT gate 14 has an input A and an output Q. In standard Boolean notation, Q=$\overline{A}$. The open circle is used to indicate the NOT or negation function and can be replaced by an inverter in any circuit. A signal is negated if it passes through the circle. The NOT gate operates in accordance with the following truth table (Table 1E).

TABLE 1E

| A | Q |
|---|---|
| 0 | 1 |
| 1 | 0 |

Boolean operations also obey the usual commutative, distributive and associative rules of normal algebra, as shown by the following Table 2.

TABLE 2

| | | |
|---|---|---|
| $\overline{\overline{A}}$ | = | A |
| A · B | = | B · A |
| A + B | = | B + A |
| A · (B + C) | = | A · B + A · C |
| A · (B · C) | = | (A · B) · C |
| A + (B + C) | = | (A + B) + C |
| A + A · B | = | A |
| A · (A + B) | = | A |
| A · ($\overline{A}$ + B) | = | A · B |
| A + $\overline{A}$ · B | = | A + B |

TABLE 2-continued

| | | |
|---|---|---|
| $\overline{A}$ + A · B | = | $\overline{A}$ + B |
| $\overline{A}$ + A · $\overline{B}$ | = | $\overline{A}$ + $\overline{B}$ |

In addition, use can be made of De Morgan's theorems, as shown below in Table 3.

TABLE 3

| | | |
|---|---|---|
| $\overline{A \cdot B}$ | = | $\overline{A}$ + $\overline{B}$ |
| $\overline{A+B}$ | = | $\overline{A}$ · $\overline{B}$ |

B. Combinational Logic

Useful and complex circuits can be designed using the basic logic gates discussed above as building blocks. An example of a combinational circuit comprising basic gates is an AND-OR-INVERT gate. FIG. 2 depicts such a gate 20. The AND-OR-INVERT gate 20, which has four inputs A, B, C, and D. It operates in accordance with the following Boolean expressions:

$Q = A \cdot B + C \cdot D$ $\overline{Q} = A \cdot B + C \cdot D$

The exclusive-OR gate (EOR or XOR) is a very useful two-input gate. The schematic symbol of the XOR gate 25 is depicted on FIG. 3A and the XOR gate operates in accordance with the truth table below (Table 3A). From the truth table, the mechanization of the exclusive-OR gate can be derived. The mechanization of the XOR gate is depicted in FIG. 3B. The mechanization of the XOR gate is implemented with two NOT gates (26 and 27), two AND gates (28 and 29) and an OR gate (30).

TABLE 3A

| A | B | Q |
|---|---|---|
| 0 | 0 | 0 |
| 1 | 0 | 1 |
| 0 | 1 | 1 |
| 1 | 1 | 0 |

FIG. 4 provides a depiction of a combinational circuit S 40. The circuit S comprises primary inputs $x_1, x_2, \ldots, x_{n-1}$, and $x_n$. The combinational circuit S also has primary outputs $f_1, f_2, \ldots, f_{k-1}$, and $f_k$. The combinational circuit S depicted in FIG. 4 comprises logic gates and cells.

In accordance with FIG. 4, let S be a combinational circuit with input variables $x_1, \ldots, x_n$ such that $f_c[p](x_1, \ldots, x_n)$ is a Boolean function that characterizes the output of pin p of the logical cell c in S.

FIG. 5 provides an illustration of such a cell 46 within combinational circuit S 40. The cell has inputs 45 and an output to pin 47. Pin 47 provides inputs 48 to other cells within combinational circuit S 40.

C. Method and Apparatus for BDD Driven Method for Formulae Area and Delay Minimization The purpose of the present invention is to enable simultaneous optimizing of size and delay for combinational circuits with underlying graphs not containing (nonoriented) cycles of interior nodes. In other words, the underlying graph of circuit (without primary inputs) are in the form of a tree. An example of circuits of such type are fanout free circuits (i.e., without branching). Such circuits are termed formulae. In a more general case, it is required for any two interior nodes (one being the predecessor of the other) that there exist a unique path between them.

The present invention is based on ordered Binary Decision Diagram (BDD) built for all output pins in the combinational circuit. We call that ordered BDD complete BDD.

The method described herein uses the notion of an ordered binary decision diagram (hereinafter BDD). Ordered BDD can be categorized based on the following properties:

- acyclic-oriented graph with two terminal vertices (with zero outgoing degree) that correspond to two constants, 0 and 1;
- with k root vertices (with zero ingoing degree) that correspond to Boolean functions $f_1, f_2, \ldots f_k$;
- for every nonterminal vertex is assigned a variable $x_i$; from the list of Boolean variables $(x_1, x_2, x_n)$;
- every nonterminal vertex has two children, a son and a daughter. The son corresponds to the transition x=1, while the daughter corresponds to the transition x=0 (here x is a variable assigned to the vertex). We plot the edge between the vertex and its son with a continuous line while between the vertex and its daughter, we plot the edge with a dotted line. FIG. 14 illustrates a vertex 300 with a son 301 and daughter 302. As seen in FIG. 14, the edge 303 from the vertex to the son is a solid, continuous line and the edge 304 from the vertex to the daughter is a dashed line.
- on any path that goes from the root to the terminal vertex the order of passed variables is the same, for example, $x_1, x_2, \ldots, x_n$, (although some variables might be missed on some path).

The root vertex realizes a function $f(x_1, x_2, \ldots, x_n)$ in the following way. Let $x_1=a_1, x_2=a_2, \ldots, x_n=a_n$ be an assignment of variables. Moving from root vertex f toward terminal vertices, we pass by terminal vertices as though they were traffic signals, e.g. if x=0 then we go to the vertex-daughter and if x=1, we go to the vertex-son.

We let f(a)=b, where $a=(a_1, \ldots a_n)$ and b is the constant we reached. FIG. 15 illustrates a BDD that realizes the function x•y. As shown in FIG. 15, from vertex 310, if x=0, the path extends to vertex 311. If x=1, the path extends to vertex 312. From vertex 312 y=0, the path extends to vertex 311. If y=1, the path extends to vertex 313.

BDD is called a reduced BDD it two additional properties are fulfilled:

i) there is no vertex for which son (z)=daughter (z);
ii) for every two vertices z and n, if son (z)=son (n) and daughter (z) daughter (n), then u=z.

It is well-known that reduced ordered BDD B for a Boolean function f(B realizes f) appears to be a canonical representation for it (like truth table, canonical sum-of-products, canonical polynomial form), that is for a fixed order of variables, two Boolean functions $f_1$ and $f_2$ are equal if two corresponding BDD's $B_1$ and $B_2$ are isomorphic:

$$f_1 = f_2 <=> B_1 = B_2$$

($B_1$ and $B_2$ are $_n$ reduced and ordered BDD's for $f_1$ and $f_2$ consequently. Two BDD's are isomorphic if they can be "coincided" with each other.).

In order to avoid unnecessary duplication of BDD (when building BDD for negations of the functions), it might be convenient to make use of BDD with negative edges. A negative edge (we mark it by crossing) indicates that the function rooted at the vertex that the edge points to be complemented. Note that we reduce ordered BDD with negative edges quite similarly and that they appear also to be canonical representation for Boolean functions. FIG. 6A illustrates a BDD 320 for the function x⊕y and FIG. 6B illustrates its variant 321 with negative edges.

One inventive feature of the present invention is a construction for a circuit a list of all possible F-equivalent set of output pins for an arbitrary logical function F. In practice, the function F might be any logical function, but the case where function F is chosen from those that are implemented in the library cells (over which the circuit is given) is of special interest.

Let us be given arbitrary combinational circuit S with primary inputs $x_1 \ldots x_n$ and with one primary output and given a logical function F depending on m variables.

Let p be an output pin of some cell v of the circuit S (or be a primary input of this circuit). We denote by $f[p](x_1 \ldots x_n)$ a Boolean function which realizes on output pin p of the cell v (on primary inputs are realized identical functions). Let us denote the output function of the circuit by $f(x_1 \ldots x_n)$. See FIG. 7.

A set of pins (some of them might coincide) $p_1, \ldots p_m, p_{m+1}$ is to be said to be F-equivalent if for logical functions $$f[p](x_1 \ldots x_n), \ldots, f[p_m](x_1 \ldots x_n), f[p_{m+1}](x_1 \ldots x_n)$$

that realized on these pins the following Boolean identity $$f[p_{m+1}] = F(f[p_1], \ldots, f[p_m]))$$

holds true. See FIG. 8.

It should be noted that the procedure of finding at the list of all F-equivalent sets of pins in combinational circuits for function F varying from the technology library can be itself considered as a powerful tool in VLSI design, in particular when doing optimization, resynthesis of circuits and also when doing mapping of circuits by library cells.

Knowledge of all F-equivalent sets of pins (for all library logical functions F) enable us to make resynthesis of combinational circuits with the purpose of simplification and to reduce gate count, to make area.reduction as well as total delay minimization. Herein, we apply this procedure to the area and delay minimization for special type of circuits (i.e. formulae) and give descriptions of the procedure itself.

We transform a combinational circuit S given over a technological basis into the equivalent circuit S over basis of cells NOT, AND and XOR by substituting tree-like subcircuits for library cells'.

We enumerate the cells of the circuit S in the same manner as is described for the method for finding equivalent and anti-equivalent pins above. Namely, we first enumerate constants 0 and 1 with numbers 0 and 1, respectively, and afterwards (starting with number 2) we enumerate primary inputs of the circuit and then all remaining cells in topological order. Topological ordering can be accomplished with well known methods. Such methods are described in U.S. patent application Ser. No. 09/626,037, which is incorporated herein by this reference as though set forth in full.

For cell v we denote by $in_1(v)$ and $in_2(v)$ the numbers of its parents and we assume them to be ordered so that $in_1(v) \leq in_2(v)$. We introduce negative edges to the circuit instead of cells of the type NOT, i.e. we allow from now on that numbers $in_1(v)$ and $in_2(v)$ might be negative and this will be meant that there is inverter NOT on the corresponding edges ($|in_1(v)|$, (v) or ($|in_2(v)|$, v) in the circuit.

So all cells of the type NOT are translated in our circuit to the sign minus by the parents' numbers. So transformed circuit S is a circuit with negative edges over basis of two cells, AND and XOR only.

During the operation of our method, we rebuild the circuit by removing its cells and edges and also changing edges' connections. For this purpose, it is convenient to introduce references. A reference of the cell v we denote by s[v] and its value in fact just points to the new end of the edge connected with v. More precisely, if s[v]=u, then it means that instead of the cell v we use the cell u and in the case s[v]=−u, we use its negation. Cell v with s[v]=v, is called a regular cell, in contrast with those for which s[v]≠v and all such cells will be removed from the circuit during the operation of a cleaning procedure.

The method works with circuits and subcircuits and is performed over the circuit's levels. For a circuit, its level with number r is a set of all circuit cells with the maximal distance from primary inputs of the circuit equal to r, r=1, 2, . . . Note that parents of any circuit cell are located in circuit levels with smaller numbers than level number of the cell itself. The main steps in the method are shown in FIG. 9.

I. Cutting of Formula and Building of Circuit Sheaf.

In the circuit S, we substitute instead of edge, say i, the constant 0 first, then the constant 1 and finally inverted x. We get three new circuits denoted by $S_0^i$, $S_1^i$ and $S_x^i$. By combining all such circuits (obtained for all edges i) with original circuit S by connecting together corresponding primary inputs we get a new circuit $$S' = S \cup \bigcup_{i \in S}(S_0^i \cup S_1^i \cup S_x^i)$$

which will be called a circuit sheaf. After doing simplification of this circuit we get a circuit S. See FIG. 10.

Transformed circuit S might have several primary outputs (on one of them original function $f(x_1, \ldots, x_n)$ realizes), but it still goes on to be a tree-like circuit.

2. Procedure of Vector Optimization with Domination.

Let S be a tree-like circuit without branching and p is an output pin of some circuit cell. In this pin a function $f[p1(x_1, \ldots x_n)$ realizes. Denote by S[p] a subcircuit that realizes this function. Circuit S[p] is not necessarily a subcircuit of the given circuit S, but it will be always built from the given circuit by connecting to some of its pin library cells. Basically, several such subcircuits can be built and at least one of them can be cut as a part of the given circuit S. We are going to compare subcircuits by associating with them vectors s[p]—the quality estimations of subcircuits S[p]. See FIG. 11.

Estimation–vectors $s[p]=(s_1, \ldots, s_k)$ are partially ordered in a natural way $$s'[p] \leq s[p] \leftrightarrow \forall i(s_i' \leq s_i)$$

In such a case, when s'[p]≤s[p] we will say that vector s[p] is absorbed by vector s'[p].

We call estimation of circuits by means of vectors as estimation with domination if from the condition that estimation vector s[p] of the subcircuit S[p] is absorbed by estimation vector s'[p] of the subcircuit S'[p] (for the same pin p). It follows that substitution instead of subcircuit S[p] in the circuit S to the subcircuit S'[p] always leads to the more optimal circuit S'.

On building or rebuilding of the circuit, we perform different operations over it. For example, we can connect buffer BUF (see FIG. 12a) (for instance, in order to strength a signal) to pin p of subcircuit S[p] or connect inverter NOT or connect together (identifying) two pins (see FIG. 12b) or connect some subcircuits $S[p_1] \ldots, S[p_m]$ to input pins of some library cell $F(x_1, \ldots, x_m)$ (see FIG. 12c) and so on. All these local operations over subcircuits generate corresponding operations over estimation vectors. For the sake of simplicity, we will not differ indicated operations over subcircuits and corresponding operations over estimation vectors.

When doing vector optimization with domination we associate to every output pin (or primary input) in the circuit S two partially ordered set of estimation vectors as follows. $V_0[p]$ is a set of estimation vectors associated with subcircuits that realizes a function f[p] and $V_1[p]$ is a set of estimation vectors associated with subcircuits that realizes the negation of f[p] respectively. These nonempty sets will be reduced, that is we remove from them estimation vectors that are absorbed by others vectors from the same set.

For any pin p (and also for primary inputs) we apply to the sets $V_0[p]$ and $V_i[p]$ the following operation of extension.

To each estimation vector s[p] from $V_0[p]$ and for all identical functions of the type BUF available in the library we connect to S[p], (i.e. to the pin p) cell BUF and write down to the set $V_0[p]$ a new estimation vector s'[p] (if it is not absorbed by the others) we just get from the vector s[p]. See FIG. 13.

Similarly, to each estimation vector s[p] from $V_0[p]$ and for all inverters of the type not available in the library we connect to S[p] (i.e. to the pin p) corresponding inverter not and write down (if it is not absorbed by the others) this time to the set $V_1[p]$ a new estimation vector s'[p] we just get from the vector s[p].

We proceed with the set $V_1[p]$ analogously. We carry out all of this while new not absorbed vectors are generated.

In the beginning of the optimization procedure we assign initial values to primary inputs and apply an extension operation to each of them. After that we look over circuit S level by level. For each pin p from the list of F-equivalent set of pins that was built for all logical library cells (with number of inputs more than 1) we find all F-equivalent sets containing pin p as output pin for the library function F. Note that at least one F-equivalent set of required type will be always available because in the given circuit S this pin itself is an output pin of some library cell. Let, for instance, $(p_1, \ldots, p_m, p)$ be one of such F-equivalent sets so that $$f[p]F(f[p_1], \ldots, f[p_m]))$$

For all possible choices of vectors $s[p_1] \ldots \in V_0[p_1], \ldots s[p_m] \in V_0[p_m]$, we apply to them operation of connection the library cell F and write down so obtained new estimation vectors to the set $V_0[p]$ (with possible absorption). So we make with all F-equivalent sets available for pin p and after that we apply an extension operation.

When looking over the circuit and building of estimation vectors we build simultaneously a graph G of operations over estimation vectors that shows us how a given estimation vector s[p] (from set $V_0[p]$ or $V_1[p]$) was obtained. See FIG. 16.

As a result of applying the above described procedure to the circuit sheaf S we build a set $V_0[p]$ for all primary outputs on one of which original function f is realized arid also a graph of operations over estimation vectors.

So, for the function f we built the set v[f] of incomparable estimation vectors from which we choose more suitable variants. Moving now backward along the operation graph G we easily design corresponding circuit S that realizes the function f with the estimation of quality S.

It is important to note that in tree-like circuits when moving along the graph of operation we intersect with any pair of sets $V_0[p]$ and $V_1[p]$ only once (inside a pair itself it might be several transitions between them) and from this it follows the uniqueness of decoding (design) process.

3. Estimation of Circuits and Operations Over Estimation Vectors.

We approximate delay d of the cell v of the library type T between its input pin a and its output pin z as a linear function on the load cap as follows $$d = t \cdot cap + d_0[T,a,z].$$

Cell load includes both wire and pin load of the net (in the case of circuits without branching there might be only one input pin in the net). Denote by tan[T,z] the maximum value of tangent inclinations t for linear function of the delay of the cell T (we take maximum over all input pin a of cell T from which its output pin z depends on). By pincap[T,a] we denote load of the input pin a of the cell v. Output pin z we numerate with 0.

Denote by S[p] a subcircuit which implements in output pin p of cell v of the circuit a function f[p]. We associate to the subcircuit S[p] the following estimation vector $$s[p] = (size, tan, delay[1 \ldots n], cap[1 \ldots n]),$$

where for i=1, . . . , n
- size is a total height of all cells from the circuit S[p];
- tan designate tan[T,0];
- delay [i] is delay from i-th primary input of the circuit to the pin p. On computing delay we put load for output pin p to be equal to 0;
- cap[i] is a total load of input pins from the subcircuit connected to the primary input $x_1$.

We illustrate local operations over estimation vectors in the example of connection operation with library cell F. Let, for instance, $(p_1, \ldots p_m, p)$ be one of F-equivalent sets of pins so that by the definition $$f[p] = F(f([p_1] \ldots f[p_m]))$$

holds true.
For all possible choices of vectors $$s[p_1] \in V_0[p_1], \ldots, s[p_m] \in V_0[p_m]$$

where $$s[p_1] = (sz_j, tn_j, d1_j[1 \ldots n], cp_j[1 \ldots n])$$

we compute estimation $s[p] = (sz, tn, d1[1 \ldots n], cp[1 \ldots n])$ as follows $$sz = size(F) + \sum_{j=1}^{m} sz_j \text{ where } size(F) \text{ denotes size of the cell F;}$$

pn=tan[F,0].

d1[i]=max(d1$_j$[i]+tn$_j$−pincap[F,j]+d$_0$T,j, 0]), where maximum is taken over all such j so that d1$_j$[i],≧0. If there are no j satisfying to the above condition, we put d1[i]=−1.

$$cp[i] = \sum_{cp_j[i] \geq 0} cp_j$$

If in addition, pin $p_j$ is primary input $x_i$ then we add to the above sum an extra term pincap[F,j]. In the case when indicated set of indexes j is empty then we put cp[i]=−1.

As an initial value of the primary input $x_i$, we assign estimation vector $s[x_i]$ having d[i]=−1 and cp[i]=−1 other coordinates are all equal to 0. We put $V_0[x_i]=\{s[x_i]\} V_1 [x_i]=\phi$ and proceed further as it was described above.

4. Constructing of the Set of F-equivalent Pins in Combinational Circuits.

Let B be complete BDD constructed for Boolean circuit S. Denote by $x_1, \ldots, x_n$ all primary inputs of the circuit S and let ordered list of variables in the graph of complete BDD is without loss of generality as follows $x_1, \ldots, x_n$. Note that edges in the underlying graph B are labeled with 0 or 1 and vertices themselves are labeled with symbols of variables from the list of variables. We build inductive family of sets with F-equivalent sets by induction reverse to the indicated order of variables. For illustration purposes we combinational circuit S (FIG. 17) and its completed BDD B (FIG. 18), wherein the following applies:

| vertex | → | function |
|--------|---|----------|
| 2 | → | $x_1$ |
| 3 | → | $x_2$ |
| 4 | → | $x_1 + x_2$ |
| 5 | → | $x_1 - x_2$ |
| 6 | → | $\underline{x_1} \oplus x_2$ |
| 7 | → | $\underline{x_2}$ |

Main steps of the algorithm are described in the flow chart given FIG. 19.

Let us describe the algorithm in a detail.

For any variable $x_i$ we extract from the underlying graph of complete BDD B a subgraph $B_i$ formed by oriented edges with the head labeled in B with variable $x_i$. These edges are included to the subgraph $B_i$ together with their both ends and their labels. We add to the subgraph $B_i$ a set of vertices $M_i$ labeled in B variable $x_j$ where j>i and also vertices of B that correspond to constant 0 and 1 (terminal nodes of BDD). Besides that in any vertex from the set $M_i$ we add a loop.

We label all such loops with both constant 0 and 1. Note that some vertices the set $M_i$ might be already in the subgraph $B_i$. In such a case, we add in such vertex loop with labels only.

Denote by $B_i$ so obtained graph. It is clear that set of vertices $V_i$ of the corresponding graph $B_i$ are imbedded to each other (i.e. they form inductive family of sets) and $V_i$ coincides with the set of all vertices of the complete BDD graph. By the definition we put the set $V_{n+1}$ to be the set of two vertices from B that correspond to constant 0 and 1. FIGS. 20a and 20b illustrate one example.

Let m denote the number of variables of the function F for which we are going to build list of all F-equivalent sets of pins.

In fact, we consequently build a list of all F-equivalent set on the sets $V_i$, for i=n+1, n, . . . , 1. Note that vertices from $V_i$, correspond to functions and we can use the notion of equivalent set for them as well.

Let us denote by $L_i$ the set of all F-equivalent sets over the set of vertices $V_i$, i=n+1, n, . . . 1.

To build initial set $L_{n+1}$ of all F-equivalent sets over the set $V_{n+1}$ is not complex. As far as the set $V_{n+1}$ represents only two vertices in which constant functions 0 and 1 are implemented, then list of all F-equivalent sets in this case will be just the set of all rows from the truth table of the form $$(_1, \ldots _m, _{m+1}) \text{ where } _{m+i}=F(4_i, \ldots, _m) \text{ and } _i \in \{0,1\}, i=1, \ldots, m, m+1.$$

Let us take $f(x_1, x_2) = x_1 \oplus x_2$ as an example. Note that $f \oplus g = h \leftarrow \rightarrow f \oplus g \oplus h = 0$. In order to avoid unnecessary duplication we will ordered (in our example) f-equivalent sets ($p_1$, $p_2$, $p_3$,) so that $p_1 \leq p_2 \leq p_3$ (for their numbers). So, for chosen function f we have $L_3=\{(0, 0, 0), (0, 1, 1)\}$.

By reverse induction $L_1$ is built from the set $L_{i-1}$ by using the graph $B_i$ described above, i=n, n−1. This is the main part of the procedure. To describe it we introduce some notions.

Let v ($v_i, \ldots, v_n, v_{n+1}$) and u=($u_i, \ldots, u_n, u_{n+1}$) be two sets of vertices from the graph $B_j$, i=n, n−1, ..., 1. We say that the set v is a 0-parent (or 1-parent) for the set u if for all j=1, ..., m, m+1 there are an edge (perhaps a loop) in the graph $B_j$ from the vertex $v_j$ to the vertex $u_j$ labeled with constant 0 (or 1 respectively). The set u is to be said under such condition as 0-son (or 1-son respectively) of the set v. For instance, in the graph B, the set (4, 5, 6) is 0-parent for the set (3, 0, 3):

Additionally, the set v=($v_1, \ldots, v_n, v_{n+1}$) of vertices of the graph $B_j$ is called fictitious (in $B_j$) if every vertex $v_j$, j=1, ..., m, m+1 has only loop in the graph $B_j$.

Note that when degrees of all vertices in $B_j$ are known, it is easy to decide whether a given set v will be fictitious or not and it is also easy to compute what number is larger—the number of its 0-parents or the number of its 1-parents.

Let us go to the description of building of the set $L_j$. Because of $L_{j-1} \subseteq L_j$ it is enough to describe how we generate new sets from $L_j - L_{j+1}$:

1. Look over F-equivalent sets from the set $L_{j+1}$. For all non-fictitious set v first we compute number cf its 0-parents and number of its 1-parents. Let for the definiteness the number of 0-parents is larger.
2. We generate all 0-parents of the set v. Let set u be a 0-parent of the set v. We find a set v which is 1-son of u.
3. We check the following condition v∈$L_j$ To speed up this checking we use hash table representation of the set $L_{j+1}$.
4. If above condition is true then we write down the set u to the set $L_j$ otherwise we choose new 0-parent. If all 0-parents are already proceeded then we choose new F-equivalent set from $L_{j+1}$.

Applying this procedure to our example, we get:

$$L_3 = (0, 0, 0)$$
$$(0, 1, 1)$$
$$L_2 = L_3 + (0, 3, 3)$$
$$(0, 7, 7)$$
$$(1, 3, 7)$$
$$L_1 = L_2 + (0, 2, 2)$$
$$(0, 4, 6)$$
$$(0, 5, 5)$$
$$(0, 6, 6)$$
$$(2, 3, 6)$$
$$(4, 5, 6)$$

For substance, for the set (0, 3, 3) one of its 0 parents (5, 4, 6) for which 1-son is (3, 1, 7) belonging to $L_2$. Thus, (4, 5, 6)∈$L_1$.

As a result we build consequently sets of F-equivalent sets $L_{n+1}, L_n, \ldots L_1$. The set $L_1$ is required set of all F-equivalent sets. If we left in this set F-equivalent sets with output pins of the given circuit only we get the total set of all F-equivalent sets for the circuit. S we need.

In our case we get (2, 3, 6) (what is expected) and (4, 5, 6).

F. Apparatus for Performing Present Invention

FIG. 21 is an illustration of a general purpose computer system, representing one of many suitable computer platforms for implementing the inventive IC design optimization methods described above. FIG. 21 shows a general purpose computer system 950 in accordance with the present invention includes a central processing unit (CPU) 952, read only memory (ROM) 954, random access memory (RAM) 956, expansion RAM 958, input/output (I/O) circuitry 960, display assembly 962, input device 964, and expansion bus 966. Computer system 950 may also optionally include a mass storage unit 968 such as a disk drive unit or nonvolatile memory such as flash memory and a real-time clock 970.

CPU 952 is coupled to ROM 954 by a data bus 972, control bus 974, and address bus 976. ROM 954 contains the basic operating system for the computer system 950. CPU 952 is also connected to RAM 956 by busses 972, 974, and 976. Expansion RAM 958 is optionally coupled to RAM 956 for use by CPU 952. CPU 952 is also coupled to the I/O circuitry 960 by.data bus 972, control bus 974, and address bus 976 to permit data transfers with peripheral devices.

I/O circuitry 960 typically includes a number of latches, registers and direct memory access (DMA) controllers. The purpose of I/O circuitry 960 is to provide an interface between CPU 952 and such peripheral devices as display assembly 962, input device 964, and mass storage 968.

Display assembly 962 of computer system 950 is an output device coupled to I/O circuitry 960 by a data bus 978. Display assembly 962 receives data from I/O circuitry 960 via bus 978 and displays that data on a suitable screen.

The screen for display assembly 962 can be a device that uses a cathode-ray tube (CRT), liquid crystal display (LCD), or the like, of the types commercially available from a variety of manufacturers. Input device 964 can be a keyboard, a mouse, a stylus working in cooperation with a position-sensing display, or the like. The aforementioned input devices are available from a variety of vendors and are well known in the art.

Some type of mass storage 968 is generally considered desirable. However, mass storage 968 can be eliminated by providing a sufficient mount of RAM 956 and expansion RAM 958 to store user application programs and data. In that case, RAMs 956 and 958 can optionally be provided with a backup battery to prevent the loss of data even when computer system 950 is turned off. However, it is generally desirable to have some type of long term mass storage 968 such as a commercially available hard disk drive, nonvolatile memory such as flash memory, battery backed RAM, PC-data cards, or the like.

A removable storage read/write device 969 may be coupled to I/O circuitry 960 to read from and to write to a removable storage media 971. Removable storage media 971 may represent, for example, a magnetic disk, a magnetic tape, an opto-magnetic disk, an optical disk, or the like. Instructions for implementing the inventive method may be provided in one embodiment, to a network via such a removable storage media.

In operation, information is inputted into the computer system 950 by typing on a keyboard, manipulating a mouse or trackball, or "writing" on a tablet or on position-sensing screen of display assembly 962. CPU 952 then processes the data under control of an operating system and an application program stored in ROM 954 and/or RAM 956. CPU 952 then typically produces data which is outputted to the display assembly 962 to produce appropriate images on its screen.

Expansion bus 966 is coupled to data bus 972, control bus 974, and address bus 976. Expansion bus 966 provides extra ports to couple devices such as network interface circuits, modems, display switches, microphones, speakers, etc. to CPU 952. Network communication is accomplished through the network interface circuit and an appropriate network.

Suitable computers for use in implementing the present invention may be obtained from various vendors. Various computers, however, may be used depending upon the size and complexity of the optimization tasks. Suitable computers include mainframe computers, multiprocessor computers, workstations, or personal computers.

It should be understood that the present invention also relates to machine readable media on which are stored program instructions for performing methods of this invention. Such media includes, by way of example, magnetic disks, magnetic tape, optically readable media such as CD ROMs, DVD, semiconductor memory such as PCMCIA cards, etc. In each case, the medium may take the form of a portable item such as a small disk, diskette, cassette, etc., or it may take the form of a relatively larger or immobile item such as a hard disk drive or RAM provided in a computer.

G. Fabrication of Optimized ICs

After the initial circuit description is optimized as discussed above, additional steps must be taken to complete the manufacture of the IC. These additional steps are very well known by those skilled in the art of semiconductor fabrication and are briefly described below.

Microelectronic integrated circuits consist of a large number of electronic components that are fabricated by layering several different materials on a silicon base or wafer. The design of an integrated circuit transforms a circuit description into a geometric description which is known as a layout. A layout consists of a set of planar geometric shapes in several layers.

The layout is then checked to ensure that it meets all of the design requirements. The result is a set of design files in a particular unambiguous representation known as an intermediate form that describes the layout. The design files are then converted into pattern generator files that are used to produce patterns called masks by an optical or electron beam pattern generator.

During fabrication, these masks are used to pattern a silicon wafer using a sequence of photolithographic steps. The component formation requires very exacting details about geometric patterns and separation between them. The process of converting the specifications of an electrical circuit into a layout is called the physical design.

Currently, the minimum geometric feature size of a component is on the order of 0.2 microns. However, it is expected that the feature size can be reduced to 0.1 micron within the next few years. This small feature size allows fabrication of as many as 4.5 million transistors or 1 million gates of logic on a 25 millimeter by 25 millimeter chip. This trend is expected to continue, with even smaller feature geometries and more circuit elements on an integrated circuit, and of course, larger die (or chip) sizes will allow far greater numbers of circuit elements.

Due to the large number of components and the exacting details required by the fabrication process, physical design is not practical without the aid of computers. As a result, most phases of physical design extensively use Computer Aided Design (CAD) tools, and many phases have already been partially or fully automated. Automation of the physical design process has increased the level of integration, reduced turn around time and enhanced chip performance.

The objective of physical design is to determine an optimal arrangement of devices in a plane or in a three dimensional space, and an efficient interconnection or routing) scheme between the devices to obtain the desired functionality.

An exemplary integrated circuit chip is illustrated in FIG. 22 and generally designated by the reference numeral 826. The circuit 826 includes a semiconductor substrate 826A on which are formed a number of functional circuit blocks that can have different sizes and shapes. Some are relatively large, such as a central processing unit (CPU) 827, a read-only memory (ROM) 828, a clock/timing unit 829, one or more random access memories (RAM) 830 and an input/output (I/O) interface unit 831. These blocks, commonly known as macroblocks, can be considered as modules for use in various circuit designs, and are represented as standard designs in circuit libraries.

The integrated circuit 826 further comprises a large number, which can be tens of thousands, hundreds of thousands or even millions or more of small cells 832. Each cell 832 represents a single logic element, such as a gate, or several logic elements interconnected in a standardized manner to perform a specific function. Cells that consist of two or more interconnected gates or logic elements are also available as standard modules in circuit libraries.

The cells 832 and the other elements of the circuit 826 described above are interconnected or routed in accordance with the logical design of the circuit to provide the desired functionality. Although not visible in the drawing, the various elements of the circuit 826 are interconnected by electrically conductive lines or traces that are routed, for example, through vertical channels 833 and horizontal channels 834 that run between the cells 832.

The input to the physical design problem is a circuit diagram, and the output is the layout of the circuit. This is accomplished in several stages including partitioning, floor planning, placement, routing and compaction.

Partitioning. A chip may contain several million transistors. Layout of the entire circuit cannot be handled due to the limitation of memory space as well as the computation power available. Therefore it is normally partitioned by grouping the components into blocks such as subcircuits and modules. The actual partitioning process considers many factors such as the size of the blocks, number of blocks and number of interconnections between the blocks.

The output of partitioning is a set of blocks, along with the interconnections required between blocks. The set of interconnections required is the netlist. In large circuits the partitioning process is often hierarchical, although non-hierarchical (e.g. flat) processes can be used, and at the topmost level a circuit can have between 5 to 25 blocks. However, greater numbers of blocks are possible and contemplated. Each block is then partitioned recursively into smaller blocks.

Floor Planning and Placement. This step is concerned with selecting good layout alternatives for each block of the entire chip, as well as between blocks and to the edges. Floor planning is a critical step as it sets up the ground work for a good layout. During placement, the blocks are exactly positioned on the chip. The goal of placement is to find a minimum area arrangement for the blocks that allows completion of interconnections between the blocks. Placement is typically done in two phases. In the first phase, an initial placement is created. In the second phase, the initial placement is evaluated and iterative improvements are made until the layout has minimum area and conforms to design specifications.

Routing. The objective of the routing phase is to complete the interconnections between blocks according to the specified netlist. First, the space not occupied by blocks, which is called the routing space, is partitioned into rectangular regions called channels and switch boxes. The goal of a router is to complete all circuit connections using the shortest possible wire length and using only the channel and switch boxes.

Routing is usually done in two phases referred to as the global routing and detailed routing phases. In global routing, connections are completed between the proper blocks of the circuit disregarding the exact geometric details of each wire and terminal. For each wire, a global router finds a list of channels that are to be used as a passageway for that wire. In other words, global routing specifies the loose route of a wire through different regions of the routing space.

Global routing is followed by detailed routing which completes point-to-point connections between terminals on the blocks. Loose routing is converted into exact routing by specifying the geometric information such as width of wires and their layer assignments. Detailed routing includes channel routing and switch box routing.

Compaction. Compaction is the task of compressing the layout in all directions such that the total area is reduced. By making the chips smaller, wire lengths are reduced which in turn reduces the signal delay between components of the circuit. At the same time a smaller area enables more chips to be produced on a wafer which in turn reduces the cost of manufacturing. Compaction must ensure that no rules regarding the design and fabrication process are violated.

Wafer Construction. Photolithography is a common technique employed in the manufacture of semiconductor devices. Typically, a semiconductor wafer is coated with a layer (film) of light-sensitive material, such as photoresist. Using a patterned mask or reticle, the wafer is exposed to projected light, typically actinic light, which manifests a photochemical effect on the photoresist, which is subsequently chemically etched, leaving a pattern of photoresist "lines" on the wafer corresponding to the pattern on the mask.

A "wafer" is a thin piece of semiconductor material from which semiconductor chips are made. The four basic operations utilized to fabricate wafers include (1) layering, (2) patterning, (3) doping and (4) heat treatments.

The layering operation adds thin layers of material, including insulators, semiconductors, and conductors, to a wafer surface. During the layering operation, layers are either grown or deposited. Oxidation involves growing a silicon dioxide (an insulator) layer on a silicon wafer. Deposition techniques include, for example, chemical vapor deposition, evaporation, and sputtering. Semiconductors are generally deposited by chemical vapor deposition, while conductors are generally deposited with evaporation or sputtering.

Patterning involves the removal of selected portions of surface layers. After material is removed, the wafer surface has a pattern. The material removed may form a hole or an island. The process of patterning is also known to those skilled in the relevant art as microlithography, photolithography, photomasking and masking. The patterning operation serves to create parts of the semiconductor device on the wafer surface in the dimensions required by the circuit design and to locate the parts in their proper location on the wafer surface.

Doping involves implanting dopants in the surface of the wafer through openings in the layers to create the n-type and p-type pockets needed to form the N-P junctions for operation of discrete elements such as transistors and diodes. Doping is generally achieved with thermal diffusion (wafer is heated and exposed to the desired dopant) and ion implantation (dopant atoms are ionized, accelerated to high velocities and implanted into the wafer surface).

Although the present invention has been described in detail with regard to the exemplary embodiments and drawings thereof, it should be apparent to those skilled in the art that various adaptations and modifications of the present invention may be accomplished without departing from the spirit and the scope of the invention. Accordingly, the invention is not limited to the precise embodiment shown in the drawings and described in detail hereinabove. Therefore, it is intended that all such variations not departing from the spirit of the invention be considered as within the scope thereof as limited solely by the claims appended hereto.

In the following claims, those elements which do not include the words "means for" are intended not to be interpreted under 35 U.S.C. §.112§¶6.

What is claimed is:

1. A method for optimizing the design of a combinational circuit, said method comprising the following steps:
   a. Constructing a circuit sheaf for a combinational circuit by: graphing the combinational circuit, replacing an edge in the graph with plural new inputs, each of said plural new inputs connecting to one of plural new circuits, and then connecting together inputs for the plural new circuits to form a modified combinational circuit; and
   b. performing vector optimization with domination, in which: subcircuits are identified that perform a function realized by an output pin of a cell within the modified combinational circuit, quality vectors are associated with each of said subcircuits, and subcircuits associated with inferior quality vectors are replaced with subcircuits associated with superior quality vectors.

2. The method of claim 1 further comprising the step of determining a complete binary decision diagram for a Boolean function (BDD B) implemented by the modified combinational circuit resulting from construction of the circuit sheaf.

3. The method of claim 2 further comprising a step of computing a list of F-sets for a specified function F from the complete BDD B, wherein each F-set is characterized such that:

$$f[p_{m+1}]=F(f[p_1],\ldots,f[p_m])$$

where $p_1 \ldots p_{m+1}$ are cell output pins in said each F-set, and $f[p_i]$ is a function realized by pin $p_i$.

4. The method of claim 1, further comprising a step of obtaining said combinational circuit by transforming an input circuit into a circuit that comprises only NOT, AND and XOR cells.

5. A system for optimizing the design of a combinational circuit, said system comprising the following steps:
   a. means for constructing a circuit sheaf for a combinational circuit by: graphing the combinational circuit, replacing an edge in the graph with plural new inputs, each of said plural new inputs connecting to one of plural new circuits, and then connecting together inputs for the plural new circuits to form a modified combinational circuit; and
   b. means for performing vector optimization with domination, in which: subcircuits are identified that perform a function realized by an output pin of a cell within the modified combinational circuit, quality vectors are associated with each of said subcircuits, and subcircuits associated with inferior quality vectors are replaced with subcircuits associated with superior quality vectors.

6. The system of claim 5 further comprising means for determining a complete binary decision diagram for a Boolean function (BDD B) implemented by the modified combinational circuit resulting from construction of the circuit sheaf.

7. The system of claim 6 further comprising means for computing a list of F-sets for a specified function F from the complete BDD B, wherein each F-set is characterized such that:

$$f[p_{m+1}]=F(f[p_1],\ldots,f[p_m])),$$

where $p_1 \ldots p_{m+1}$ are cell output pins in said each F-set, and $f[p_i]$ is a function realized by pin $p_i$.

8. The system of claim 5 further comprising means for obtaining said combinational circuit by transforming an input circuit into a circuit that comprises only NOT, AND and XOR cells.

9. A computer-readable medium storing computer-executable process steps for optimizing the design of a combinational circuit, said process steps comprising:

a. Constructing a circuit sheaf for a combinational circuit by: graphing the combinational circuit, replacing an edge in the graph with plural new inputs, each of said plural new inputs connecting to one of plural new circuits, and then connecting together inputs for the plural new circuits to form a modified combinational circuit; and b. performing vector optimization with domination, in which: subcircuits are identified that perform a function realized by an output pin of a cell within the modified combinational circuit, quality vectors are associated with each of said subcircuits, and subcircuits associated with inferior quality vectors are replaced with subcircuits associated with superior quality vectors.

10. The computer-readable medium of claim 9 further comprising the process step of determining a complete binary decision diagram for a Boolean function (BDD B) implemented by the modified combinational circuit resulting from construction of the circuit sheaf.

11. The computer-readable medium of claim 10 further comprising the process step of computing a list of F-sets for a specified function F from the complete BDD B, wherein each F-set is characterized such that:

$$f[p_{m+1}]=F(f[p_1],\ldots,f[p_m])),$$

where $p_1 \ldots p_{m+1}$ are cell output pins in said each F-set, and $f[p_i]$ is a function realized by pin $p_i$.

12. The computer-readable medium of claim 9 further comprising the process step of obtaining said combinational circuit by transforming an input circuit into a circuit that comprises only NOT, AND and XOR cells.

* * * * *